US007056866B1

(12) United States Patent  
Chu

(10) Patent No.: US 7,056,866 B1
(45) Date of Patent: Jun. 6, 2006

(54) SUPERCONDUCTIVITY IN SQUARE-PLANAR COMPOUND SYSTEMS

(75) Inventor: Ching-Wu Chu, Houston, TX (US)

(73) Assignee: University of Houston-University Park, Houston, TX (US)

( * ) Notice: Subject to any disclaimer, the term of this patent is extended or adjusted under 35 U.S.C. 154(b) by 785 days.

(21) Appl. No.: 07/032,041

(22) Filed: Mar. 26, 1987

Related U.S. Application Data

(63) Continuation-in-part of application No. 07/012,205, filed on Feb. 6, 1987, now abandoned, which is a continuation-in-part of application No. 07/006,991, filed on Jan. 26, 1987, now abandoned, which is a continuation-in-part of application No. 07/002,089, filed on Jan. 12, 1987, now abandoned.

(51) Int. Cl.
*C04B 101/00* (2006.01)
*H01L 39/12* (2006.01)
*H01B 12/00* (2006.01)

(52) U.S. Cl. .................. 505/125; 505/126; 505/490; 505/500; 505/780

(58) Field of Classification Search ............... 252/520, 252/521, 518; 423/263, 593; 501/104, 108, 501/123, 126, 135, 152; 29/599; 420/901; 428/930; 505/100, 125, 126, 779, 780, 490, 505/500
See application file for complete search history.

(56) References Cited

U.S. PATENT DOCUMENTS

| 4,045,375 | A | * | 8/1977 | Komatu | 252/519 |
| 4,316,785 | A | * | 2/1982 | Suzuki | 204/192.24 |
| 4,357,426 | A | * | 11/1982 | Murata et al. | 501/135 |
| 4,482,644 | A | * | 11/1984 | Beyerlein | 502/303 |
| 4,503,166 | A | * | 3/1985 | Beyerlein | 502/303 |
| 4,645,622 | A | * | 2/1987 | Kock | 252/521 |

OTHER PUBLICATIONS

Michel, C. et al., "The Oxygen Defect Perovskite Ba La$_4$ Cu$_5$ O$_{13.4}$, A Metallic Conductor", *Mat. Res. Bull.*, vol. 20, pp 667-671 (1985).*
Nguyen, N. et al., "Oxygen Defect k$_2$ NiF$_4$—Type Oxides : The Compounds La$_{2-x}$Sr$_x$CuO$_{4x/2+d}$", *J. Solid State Chem.*, 39, 1981, pp 120-127.*
ShapLygin, I.S. et al. "Preparation and Properties of The Compounds Ln$_2$CuO$_4$(Ln= La, Pr, Nd, Sm, Eu, Gd) and Some of Their Solid Solutions", *Russian Journal of Inorganic Chem.*, 24 (6), pp820-824, 1979.*
Rhyne, J.J., et al., "Phonon Density of Superconducting YBa$_2$Cu$_3$O$_7$and The Non-Superconducting Analogy Ba$_2$Cu$_3$O$_{65}$ " *Physical Review B.,.**
Bednorz et al "Possible High Tc Superconductivity in the Ba-La-Cu-O System", Z. Phys. B, pp 189-193, 1986.*
Michel et al "The Oxygen Defect Perovskite BaLa4Cu5O13.4 . . . ", Mat. Res. Bull., vol. 20, 667-671, 1985.*

* cited by examiner

*Primary Examiner*—Mark Kopec
(74) *Attorney, Agent, or Firm*—Akin Gump Strauss Hauer & Feld LLP; Charles M. Cox

(57) ABSTRACT

Described is a superconducting composition comprising an oxide complex of the formula $[L_{1-x}M_x]_aA_bO_y$, wherein L is lanthanum, lutetium, yttrium, or scandium; A is copper, bismuth, titanium, tungsten, zirconium, tantalum, niobium, or vanadium; M is barium, strontium, calcium, magnesium or mercury; and "a" is 1 to 2; "b" is 1; and "x" is a number in the range of 0.01 to 1.0; and "y" is about 2 to about 4. The oxide complexes of the invention are prepared by a solid-state reaction procedure which produces an oxide complex having an enhanced superconducting transition temperature compared to an oxide complex of like empirical composition prepared by a coprecipitation—high temperature decomposition procedure. With an oxide complex prepared by the solid-state reaction of the invention a transition temperature as high as 100°K has been observed even under atmospheric pressure.

15 Claims, 5 Drawing Sheets

• Cu  ○ O  ○ Ba  ● La  ◐ Ba or La

SUPERCONDUCTIVITY IN SQUARE-PLANAR COMPOUND SYSTEMS

CROSS-REFERENCE TO RELATED APPLICATIONS

This is a continuation-in-part of Ser. No. 07/012,205, filed Feb. 6, 1987 entitled "High Transition Temperature Superconducting Composition", now abandoned, which in turn is a continuation-in-part of Ser. No. 07/006,991, filed Jan. 26, 1987, entitled "Superconducting Compositions And Method For Enhancing Their Transition Temperatures By Pressure", now abandoned, which in turn is a continuation-in-part of Ser. No. 07/002,089, filed Jan. 12, 1987, entitled "Superconducting Composition and Method.", now abandoned.

STATEMENTS REGARDING FEDERALLY SPONSORED RESEARCH OR DEVELOPMENT

This invention was made with United States Government support under Grant No. DMR-8204173 awarded by the National Science Foundation and Grant No. NAGW-997 awarded by the National Aeronautics and Space Administration, and the United States Government has certain rights in the invention.

BACKGROUND OF THE INVENTION

This invention relates to superconducting compositions, i.e., compositions offering no electrical resistance at a temperature below a critical temperature; to processes for their production and to methods for their use; and to methods for increasing the superconducting transition temperature of superconducting compositions.

Superconductivity was discovered in 1911. Historically, the first observed and most distinctive property of a superconductive material is the near total loss of electrical resistance by the material when at or below a critical temperature that is a characteristic of the material. This critical temperature is referred to as the superconducting transition temperature of the material, $T_c$. The criteria by which a selection of the critical temperature value is determined from a transition in the change in resistance observed is often not obvious from the literature. Many past authors have chosen the mid-point of such curve as the probable critical temperature of their idealized material, while many others have chosen to report as the critical temperature the highest temperature at which a deviation from the normal state resistivity property is observed. Hence, the literature may report differing temperatures within a narrow range as the critical or superconducting transition temperature for the same material, depending on the particular author's method for selecting $T_c$ from the observed data.

The history of research into the superconductivity of specific materials began with the discovery in 1911 that mercury superconducts at a transition temperature of about 4°K. In the late 1920's, NbC was found to superconduct at a higher temperature, namely up to about 10.5°K. Thereafter other compounds and alloys of Nb were examined and various Nb compositions were discovered with progressively, but only slightly higher, superconducting transition temperatures. In the early 1940's NbN was observed with a transition temperature of about 14°K; $Nb_3Sn$ was reported in the early 1950's; $Nb_3$ (Al—Ge) was reported in the late 1960's; and $Nb_3Ge$ was reported in the early 1970's to have a transition temperature of about 17°K. Careful optimization of $Nb_3Ge$ thin films led to an increase of the critical temperature for such material up to 23.3°K. While this work led to progress the maximum temperature at which superconductivity could occur was raised to only 23.3°K since research started three-quarters of a century ago. The existing theories explained the superconductivity of these materials, but did not predict superconductivity of higher than 40°K. Significant progress in finding materials which superconduct at higher transition temperatures than that of $Nb_3Ge$ thin films was not made until 1986.

In 1986, specially prepared coprecipitated and heat treated mixtures of lanthanum, barium, copper and oxygen, that have an abrupt decrease in resistivity "reminiscent of the onset of percolative superconductivity" were reported by J. G. Bednorz and R. A. Muller, "Possible High $T_c$ Superconductivity In The Ba—La—Cu—O System," Z. Phys. B.—Condensed Matter, 64, pp. 189–193 (1986). Under atmospheric pressure conditions, the abrupt change in resistivity for these compositions—i.e., that temperature at which a portion of the material begins to show properties reminiscent of percolative superconductivity—were reported to approach the 30°K range. The authors refer to this phenomenon as a "possible" case of superconductivity. The compositions reported by Bednorz et al to have such properties at a temperature as high as 30° K comprise $La_{5-x}Ba_xCu_5O_{5(3-y)}$ where X=0.75 to 1 and Y>0. The Bednorz et al compositions are prepared by coprecipitation of Ba-, La- and Cu-nitrate solutions by addition to an oxalic acid solution followed by decomposition and solid-state reaction of the coprecipitate at 900° C. for 5 hours. Thereafter, the composition is pressed to pellets at 4 kilobars and the pellets are sintered at a temperature below 950° C. in a reduced oxygen atmosphere of $0.2 \times 10^{-4}$ bar. Bednorz et al reported that this method of sample preparation is of crucial importance to obtaining the observed phenomena.

Superconductivity is a potentially very useful phenomenon. It reduces heat losses to zero in electrical power transmission, magnets, levitated monorail trains and many other modern devices. However, superconductivity of a material occurs only at very low temperatures. Originally, and until the inventions outlined herein, liquid helium was the required coolant to provide the conditions necessary for superconductivity to occur.

It would be desirable to produce a superconducting composition that has a transition temperature which exceeds those of superconducting compositions previously described. It would be particularly desirable to develop a superconducting composition that has the potential of having a $T_c$ of 77°K or higher. Such a composition would enable the use of liquid nitrogen instead of liquid helium to cool the superconducting equipment and would dramatically decrease the cost of operating and insulating superconducting equipment and material.

BRIEF SUMMARY OF THE INVENTION

Described is a superconducting composition comprising an oxide complex of the formula $[L_{1-x}M_x]_aA_bO_y$, wherein "L" is scandium, yttrium, lanthanum, cerium, praseodymium, neodymium, samarium, europium, gadolinium, terbium, dysprosium, holmium, erbium, thulium, ytterbium, or lutetium, and preferably "L" is yttrium, lanthanum neodynium, samarium, europium, gadolinium, erbium or lutetium; "A" is copper, bismuth, titanium, tungsten, zirconium, tantalum, niobium, or vanadium and "A" perferably is copper; "M" is barium, strontium, calcium, magnesium or mercury and "M" is preferably barium or strontium; and "a" is 1 to 2; "b" is 1; and "y" is about 2 to about 4 and "x" is from about 0.01 to 1.0 maximum, and when "a" is 1 "x" is preferably from about 0.60 to about 0.90 and most preferably from about 0.65 to about 0.80 and when "a" is 2 "x" is preferably from about 0.01 to about 0.5 and most preferably from about 0.07 to about 0.5. The oxide complexes of the invention are prepared by a solid-state reaction procedure which produces an oxide complex having an enhanced superconducting transition temperature compared to an oxide complex of like empirical composition prepared by a coprecipitation—high temperature decomposition procedure.

When "L" is lanthanum and "M" is barium, the transition temperatures of onset and complete superconductivity, $T_{co}$ and $T_{c1}$ (as seen in FIG. 5), respectively, may be increased by subjecting the barium species of a lanthanum containing oxide complex to pressure up to 18 kilobars. Likewise the non-barium species of the oxide complexes of the invention exhibit an enhancement to higher limits of their superconducting transition temperatures when subjected to high pressures.

The application and maintenance of high pressure on such oxide complexes is believed to enhance the transition temperature to higher limits by reducing the interatomic spacings between elements L, A, M and O compared to their respective spacings when the oxide complex is under atmospheric pressure only.

Alternatively, an alkaline earth metal having an atomic radius smaller than barium may be used in whole or in part to fulfill the alkaline earth metal constituent requirement to provide an oxide complex having reduced interatomic spacings between elements, L, A, M and O even when the oxide complex is under only atmospheric pressure, compared to a pure barium species, thus increasing $T_{co}$ and $T_{c1}$. Application of pressure up to 18 kilobars will even further enhance the $T_{co}$ and $T_{c1}$ of such substituted or non-barium oxide complex species.

It has also been found that oxide complexes having superconductivity in the 90°K range are produced wherein "L" is yttrium, lanthanum, neodymium, samarium, europium, gadolinium, erbium or lutetium and "a" is 1 and "x" is from about 0.65 to about 0.80, preferably about 0.667. Such oxides may be produced to have unique square planar "A"-atoms each surrounded by four oxygen atoms. The 90°K range for superconductivity of such oxides wherein "A" is copper and "M" is barium is believed to be attributable to the quasi-two-dimensional assembly of $CuO_2$—Ba—$CuO_2$-layers sandwiched between two "L" layers.

With an oxide complex prepared by the solid-state reaction of the invention a transition temperature as high as 100°K has been observed even under atmospheric pressure.

DETAILED DESCRIPTION OF THE PREFERRED EMBODIMEMTS

Figure 1:
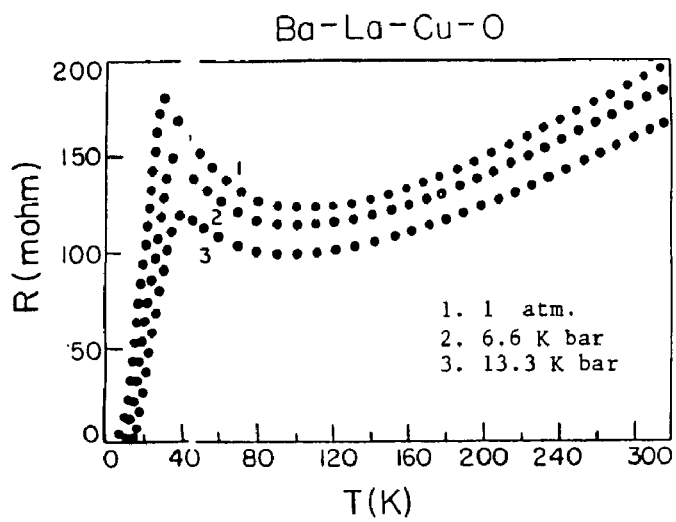
FIG. 1 illustrates the reduction in electrical 5 resistance as temperature is decreased of a La—Ba—Cu—O composition as prepared according to Example V.

Superconducting compositions of this invention comprise an oxide complex defined by the following formula:

$$[L_{1-x}M_x]_a A_b O_y$$

wherein "L" is an element selected from the group consisting of scandium, yttrium, -lanthanum, cerium, praseodymium, neodymium, samarium, europium, gadolinium, terbium, dyprosium, holmium, erbium, thulium, ytterbium, lutetium or a mixture of one or more of these elements, and preferably "L" is yttrium, lanthanum neodynium, samarium, europium, gadolinium, erbium or lutetium; wherein "A" is an element selected from the group consisting of copper, bismuth, titanium, tungsten, zirconium, tantalum, niobium, vanadium or a mixture of one or more of these elements and "A" is preferably copper; wherein "M" is an element selected from the group consisting of barium, strontium, calcium, magnesium and mercury or a mixture of one or more of these elements and "M" is preferably barium or strontium; and wherein "a" is 1 to 2, "b" is 1, and "y" is about 2 to about 4, "x" is from about 0.01 to 1.0 maximum. Preferably when "a" is 1, "x" is from about 0.60 to about 0.90 and most preferably about 0.65 to about 0.80, whereas when "a" is 2 "x" is preferably from about 0.01 to about 0.5 and most preferably from about 0.075 to about 0.5. The amount of oxygen present in the compositions of the present invention depends upon the valence requirements of the other elements and the defects resulting from the particular heat treatment used to make the composition. The molar oxygen content "y" is about 2 to 4 times "b," as used in the preceding equation.

It has been observed that the transition temperature of such an oxide complex is increased by the application of pressure to the composition. It is believed that subjecting the oxide complex to high pressures decreases the interatomic distances or lattice spacing in such complexes and that this may, at least in part, account for the enhancement of transition temperatures that has been observed. Another way to obtain a decrease of the interatomic distances or lattice spacings is during the preparation of the oxide complex. Thus, for example, an alkaline earth metal having an atomic radius smaller than barium may be used in whole or in part to fulfill the alkaline earth metal requirement to produce an oxide complex having reduced interatomic distances or lattice spacing compared to an oxide complex with barium alone, with a consequent increase in the transition temperature of the non-barium oxide complex resulting compared to one produced with barium alone. The transition temperature is increased in such an oxide complex even as measured under atmospheric pressure.

The present invention also provides a solid-state reaction method for making such superconducting oxide complexes, one embodiment of which is described as follows and for convenience is referred to as the powder reaction method. Selected amounts of solid powdered compounds containing L, M, A, and O, preferably appropriate amounts of $L_2O_3$ or $L(OH)_3$, $MCO_3$ and AO are thoroughly mixed. Preferably mixing of the solid powder compounds is performed by an intensive mixer such as a jar mill or more preferably a ball mill. The powdered mixture is then heated in an oxygen-containing atmosphere, at an appropriate pressure, and at a temperature of between about 640° C. and 800° C. for a time sufficient to react the mixture in the solid state. The temperature of the mixture is conveniently increased to the 640–800° C. target temperature at a rate of 10° C. per minute. The mixture is kept at this target temperature for a time sufficient to allow the solid-state mixture to react. Preferably, the mixture is allowed to react for about an hour. The resulting mixture is then heated at a temperature between about 900° C. and 1100° C., preferably for at least twelve hours. The temperature is raised to about 900 to about 1100° C., conveniently at a rate of about 30° C. per minute. The samples are kept at the 900 to 1100° C. temperature for a time sufficient to complete the solid state reaction of the materials, the completed solid state reacted product being that product having the components completely diffused through the composition. The samples are then cooled to room temperature. The reaction mixture is then homogenized. The sample is homogenized preferably by pulverizing the reacted mixture in a jar mill and more preferably in a ball mill for at least 1 hour. The pulverized mixture is then heated rapidly to between 900–1100° C. The mixture is maintained at this temperature preferably for at least 6 hours. After this step, the mixture is compressed under a pressure of at least one kilobar. This compresses the powdered mixture into pellets or other coherent compacted form. The pellets are then sintered into solid cylinders. This sintering process is preferably performed at a pressure between zero to two kilobars at a temperature of between about 900–1100° C. and for about four hours. Finally, the samples are quenched rapidly from this temperature of between 900–1100° C. to room temperature, in air or an inert gas atmosphere such as Ar. This final step, along with thorough mixing of this mixture, decreases the range of the superconducting transition of the composition. This superconducting transition range is the range of temperatures between the point when a portion of the material shows superconductive properties (onset transition temperature) and the temperature at which the composition shows complete superconductive properties.

Compositions made in this process may be compressed to pressures that exceed atmospheric pressure, preferably in the range of 1 to 20 kilobars. This increase in pressure typically increases the $T_c$ of the composition.

An alternative method for making such oxide complex superconductive compositions includes the following steps, and for convenience is referred to as the compressed powder reaction method. Selected amounts of solid powdered compounds containing L, M, A, and O are thoroughly mixed, preferably by selecting appropriate amounts of $L_2O_3$ or $L(OH)_3$, $MCO_3$ and AO. The thoroughly mixed powder mixture is compressed into pellets which are thereafter reacted at a temperature between about 800° C. and about 1100° C., preferably about 900° C. to about 1100° C., for a time sufficient to complete the solid state reaction.

Thereafter the reacted pellets are rapidly quenched to room temperature. Again, mixing is preferably accomplished by an intensive mixer such as a jar mill or more preferably a ball mill. Pelletization of the oxide mixture is carried out at an applied pressure of from about 100 to about 30,000 psi and preferably at an applied pressure of from about 100 to about 500 psi, most preferably at about 500 psi. Reaction of the pelletized mixture may be conducted in air for about 5 minutes to about 24 hours, and most preferably in a reduced oxygen atmosphere of about 2000μ for about 5 to about 30 minutes preferably for about 5 to about 15 minutes. Following the completion of the reaction step the reacted pellet composition is rapidly quenched to room temperature in air, such as by being placed on an aluminum plate as a heat sink. Wherein the oxide complex is prepared by reaction under a reduced oxygen atmosphere the reacted pellet may be rapidly quenched by passing a flow of ambient temperature oxygen through the oven over the sample.

Another method for preparing oxide complexes which exhibit significantly enhanced transition temperatures includes the following steps: thoroughly mixing selected amounts of solid powdered compounds containing L, M, A and O, preferably by selecting appropriate amounts of $L_2O_3$ or $L(OH)_3$, $MCO_3$ and AO; depositing the oxide mixture on a copper substrate which has been cleaned of its copper oxide surface film, preferably by acid cleaning in dilute hydrochloric acid solution; compressing the oxide mixture against the copper substrate at an applied pressure of from about 100 to about 1000 psi, preferably at about 100 to 200 psi, to form the oxide mixture into a film or layer on the copper substrate; heating the copper substrate and oxide mixture layered thereon to a temperature of from about 900 to about 1100° C. in air for from about 5 minutes to about 24 hours, and preferably for about 5 to about 15 minutes; and quenching the copper substrate and oxide mixture layered thereon to room temperature in air. Inspection of the oxide mixture layer which results from this method of preparation discloses that it comprises three phases, the first of which adjacent the copper substrate comprises a glassy insulating layer phase; the second phase is the superconducting layer phase; and the third phase which borders with the second superconducting phase is a powdery compound which is also an insulator layer phase.

Still another alternative method includes within any of the immediately foregoing solid-state reaction methods the step of reducing interatomic distances, either by the application of pressure to the oxide complex or by the use of atomic elements which provides smaller lattice spacings. A preferred oxide complex which exhibits a significantly enhanced superconducting transition temperature is prepared by utilizing yttrium as the "L" component.

Oxide complexes of the formula $[L_{1-x}M_x]_aA_bO_y$ prepared by a solid-state reaction procedure as described exhibit superconducting properties at transition temperatures higher than heretofore reported. The barium species of the oxide complex, that is wherein "M" is only barium, as prepared by the described solid-state reaction procedures exhibits superconducting properties beginning at a higher onset temperature ($T_{co}$) than the temperature reported by Bednorz et al as that wherein, for an oxide complex of similar empirical composition but prepared by a coprecipitation method, a phenomenon "reminiscent of the onset of percolative superconductivity" was observed. Further, it has been surprisingly found that the superconductivity transition temperature of oxide complexes of the formula $[L_{1-x}M_x]_aA_bO_y$ prepared by the solid-state reaction procedure is further enhanced towards higher limits by the application to and maintenance of pressure on the oxide complex up to about 18 kilobars.

Based upon present belief, it is thought that the application of and maintenance of high pressure on such oxide complexes enhances their superconducting transition temperature by producing a reduction of the interatomic distance or lattice spacing between the metal atoms forming the complex. The application and maintenance of high pressure on such oxide complexes may also enhance the transition temperature by suppressing instabilities detrimental to a high temperature superconductivity and thus permitting the existence of superconducting phase species to occur within the body of the oxide complex at a higher temperature than that at which such phase could form at atmospheric pressure. Pressure has been found to enhance the $T_c$ of La—Ba—Cu—O and La—Sr—Cu—O oxide complexes at a rate of greater than $10^{-3}$°K-bar$^{-1}$ and to raise the onset $T_{co}$ to 57°K, reaching a zero-resistance state $T_{c1}$ at 40°K. It is believed that pressure reduces the lattice parameter and enhances the $Cu^{+3}/Cu^{+2}$ ratio in the compounds. The unusually large pressure effect on $T_c$ suggests that the high temperature superconductivity in La—Ba—Cu—O and La—Sr—Cu—O complexes may be associated with interfacial effects arising from mixed phases; interfaces between the metal and insulator layers, or concentration fluctuations within the $K_2NiF_4$ phase; strong superconducting interactions due to the mixed valence states; or a yet unidentified phase. Although the unexpected enhancement of transition temperature that the application of pressure to such oxide complexes produces has been repeatedly observed, a mechanism which adequately explains the pressure effect has not yet been fully determined.

The transition temperature of such oxide complexes is enhanced by the application of pressure, and that this effect is at least in part due to a resulting reduction in interatomic spacing in the oxide complex is evidenced by an enhancement of transition temperature that may be produced without the application of extrinsic pressure by employing in the formation of the oxide complex an alkaline earth metal having smaller atomic radius than that of barium. A similar enhancement of transition temperature has been observed when yttrium is used as the "L" component rather than lanthanum.

Hence, when preparing an oxide complex of the invention, it is preferred to completely or partially substitute for the barium atoms, atomic radius of 2.22 angstroms, smaller alkaline earth metal atoms, i.e., strontium, atomic radius of 2.15 angstroms, calcium, atomic radius of 1.97 angstroms, or magnesium, atomic radius of 1.6 angstroms. Similarly, complete or partial substitution of the lanthanum atoms, atomic radius of 1.87 angstroms, with the smaller lutetium atoms, atomic radius of 1.75 angstroms, or yttrium, atomic radius 1.78 angstroms, will provide this same effect. The application of pressure to such oxide complexes that are prepared to have decreased interatomic spacings will further enhance the transition temperature of such compositions to higher limits.

Alternatively, the deposition of a lanthanum, barium, copper, oxide film on a substrate with smaller lattice parameters, such as a lanthanum, calcium, copper oxide substrate, will reduce the interatomic spacing of the superconducting composition, and thus will increase the $T_c$ of the oxide complex composition. Further, cladding of a lanthanum, barium, copper oxide composition with metals having larger thermal expansion coefficients, such as copper, will apply and maintain the pressure required to reduce the interatomic distances between the elements in the oxide complex composition and hence will increase the T of the composition.

When yttrium was utilized as the "L" component in substitution of lanthanum to provide an oxide complex of the nominal composition $Y_{1.2}Ba_{0.8}CuO_y$, the oxide complex exhibited superconductivity starting at 98°K and a zero-resistance state at 94°K. In strong contrast to the La—Ba—Cu—O and La—Sr—Cu—O oxide systems with a $K_2NiF_4$ like phase structure, the Y—Ba—Cu—O oxide system was observed to have only a slight enhancement of its transition temperature by the application of pressure up to 19 Kbar. Examination of the Y—Ba—Cu—O oxide revealed that it was comprised of mixed phases. The phases were separated and identified as tetragonal $YBa_2Cu_3O_{6+\partial}$ (black) and orthorhombic $Y_2BaCuO_5$ (green). The black and green phases comprised at lease 95% by volume of the initial Y—Ba—Cu—O oxide complex. Magnetic measurements on the oxide complex showed that the black phase was responsible for the high temperature superconductivity detected. Single phase $YBa_2Cu_3O_{6+\partial}$ samples (hereafter referred to as "YBCO") were prepared and exhibited a 100% ac diamagnetic shift. The molar oxygen content of the black phase is greater than twice that of the molar content of copper by an exact amount as yet undetermined, as indicated by the $\partial$ symbol in the phase formula.

The high temperature superconducting black phase, on a single phase basis, corresponds to the formula $[L_{1-x}M_x]_a A_bO_y$ wherein "L" is yttrium, "M" is barium, "A" is copper, "a" is 1, "b" is 1, "y" is 2 to 4 and "x" is 0.667. Further tetragonal oxide species were prepared according to the formula as above stated, but where "L" is lanthanum, neodymium, samarium, europium, gadolinium, erbium or lutetium. For convenience the oxide complexes so prepared are hereafter referred to as LaBCO, NeBCO, SaBCO, GaBCO, ErBCO, and LuBCO, respectively. All such oxide species were found to be superconducting with an onset temperature $T_{co}$ between 90 and 95°K and a zero-resistance state $T_{c1}$ between 70 and 94°K. This shows that different trivalent "L"-atoms do not dramatically affect the superconductivity property which is an intrinsic property in this class of compounds. The high temperature superconductivity observed in this class of compounds is believed to be associated with the $CuO_2$—Ba—$CuO_2$—Ba—$CuO_2$ plane assembly sandwiched between the "L"-layers. The significance of the inter-plane coupling within the layer-assembly is especially evident from the enhanced superconducting transition from ~30°K in the $K_2NiF_4$ like structure of a La—Ba—Cu—O or La—Sr—Cu—O type oxide (of Examples I–VIII) to ~90°K in the $LBa_2Cu_3O_{6+\partial}$ structure as so prepared. Bigger layer-assembly is predicted to yield even higher $T_c$ superconducting oxides.

All samples of the LaBCO, NeBCO, SaBCO, EBCO, GaBCO, ErBCO and LuBCO with an $LBa_2Cu_3O_{6+\partial}$ structure were synthesized by the solid state reaction of appropriate amounts of sesqui oxides of La, Nd, Sm, Eu, Gd, Er and Lu, with appropriate amounts of $BaCO_3$ and CuO in a fashion as described in Examples XII to XIV Structural analyses were carried out with a Rigaku D-MAX X-ray power diffractometer. Samples of dimensions 1 mm×0.5 mm×4 mm were cut from the sintered cylinders. A standard four-lead technique was employed for the resistance R measurements, and a Linear Research ac inductance bridge was used for the magnetic susceptibility $\chi$ determinations. The temperature was measured using an Au+0.07% Fe-Chromel or chromel-alumel thermocouple above 30°K and a Ge-thermometer below.

The powder X-ray diffraction patterns showed that all samples except LuBCO possess the single tetragonal $YBa_2Cu_3O_{6+\partial}$ structure, although for a couple of cases orthohombic symmetry was also detected. The lattice parameters are given in Table 1. In addition to the tetragonal $LBa_2Cu_3O_{6+\partial}$ structure, LuBCO exhibits other phases, which, it is believed, can be eliminated by proper heat-treatments.

Figure 11:
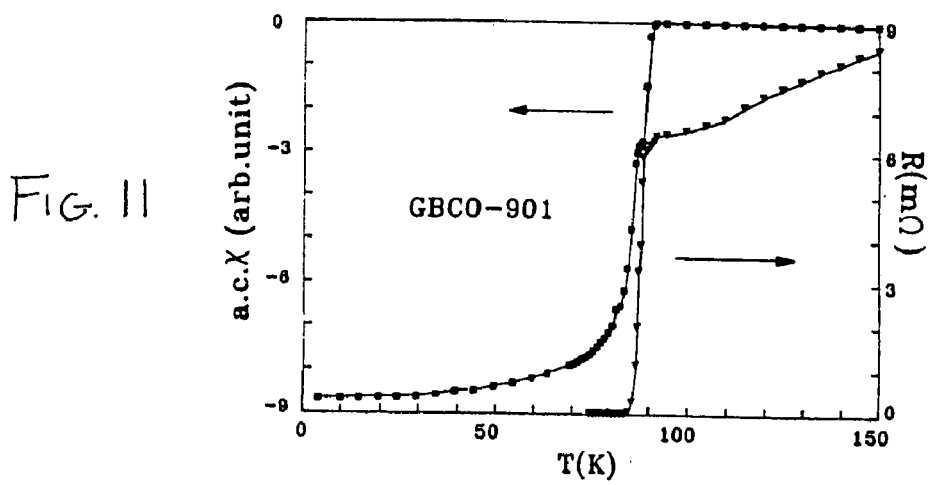
FIG. 11 illustrates the temperature dependence of resistance and magnetic suspectibility of a $GdBa_2Cu_3O_{6+\delta}$ oxide complex as prepared according to Example XIV.
Figure 12:
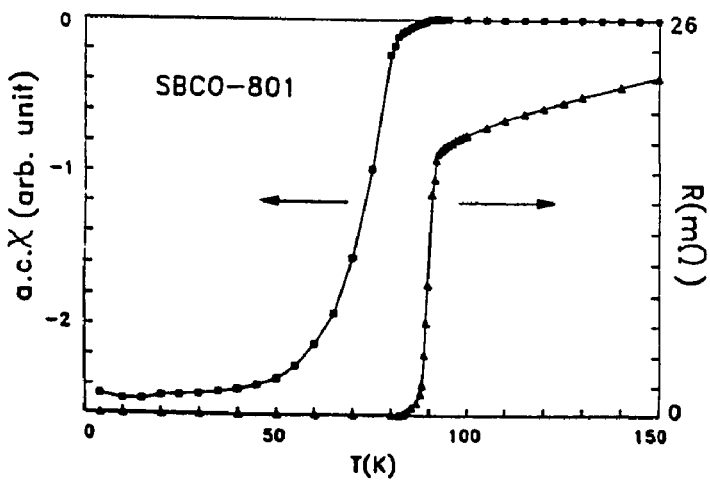
FIG. 12 illustrates the temperature dependence of resistance and magnetic suspectibility of a $SmBa_2Cu_3O_{6+\delta}$ oxide complex as prepared according to Example XIV.

All samples studied show rather sharp R-drops with an onset temperature $T_{co}$ between 91–95°K, a zero-R state temperature $T_{c1}$ between 70–94°K, and a deviation from linear temperature dependence of R at temperature $T_{dl}$ between 93 and 160°K. Whether $T_{dl}$ represents the beginning of superconductivity is yet to be determined. All relevant data are given in Table 1 and the typical temperature-dependence of R is displayed in FIGS. 11 and 12 for GaBCO and SaBCO, respectively. It is, therefore, evident that the sample starts to superconduct at ~90 K consistent with the R-measurements, and the whole sample becomes superconducting at lower temperatures.

Figure 13:
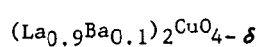
FIG. 13 is a schematic representation of the structures of a $(La_{0.9}Ba_{0.1})CuO_{4-\delta}$ oxide complex structure as prepared according to Example VIII and of a $LaBa_2Cu_3O_{6+\delta}$ oxide complex structure as prepared according to Example XIII.
Figure 13:
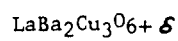
Figure 13:
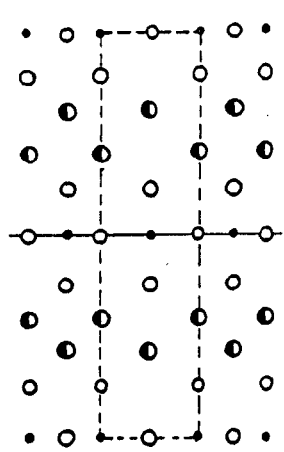
Figure 13:
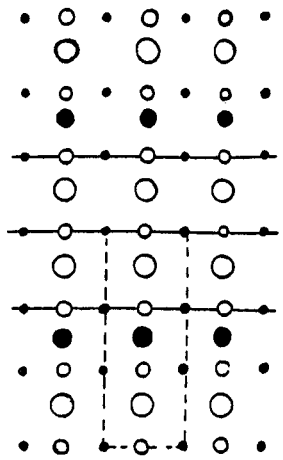
Figure 14:
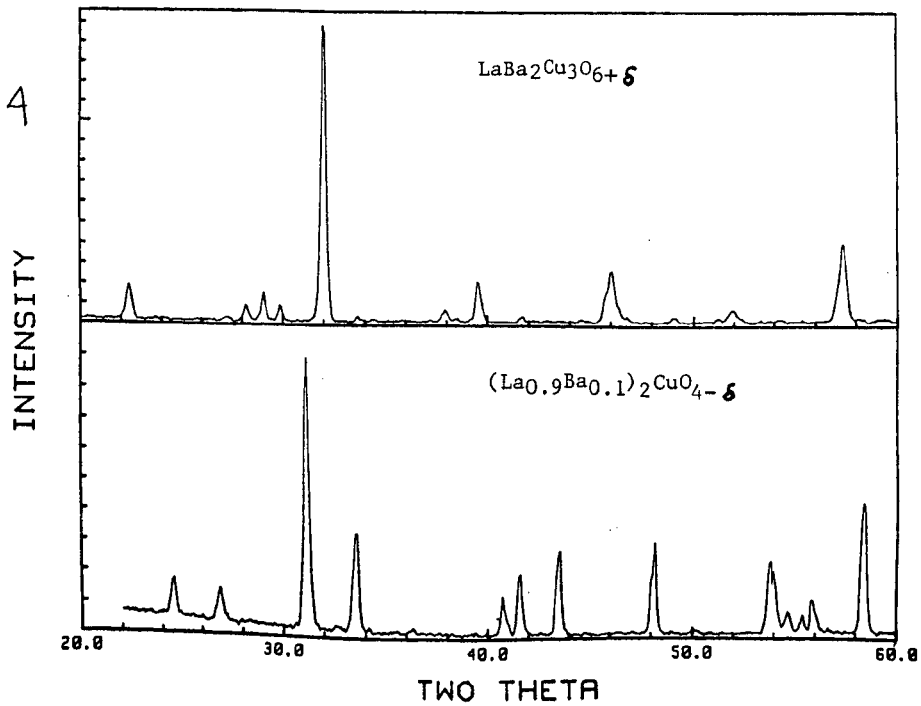
FIG. 14 is the X-ray diffraction patterns for a  $(La_{0.9}Ba_{0.1})CuO_{4-\delta}$ oxide complex as prepared according to Example VIII and for an $LaBa_2Cu_3O_{6+\delta}$ oxide complex as prepared according to Example XIII.

The observation of superconductivity with an almost 30 constant $T_{cO}$ in the $LBa_2Cu_3O_{6+\partial}$ class for "L"=Y, La, Nd, Eu, Sm, Gd, Er and Lu clearly demonstrates that superconductivity in this class of compounds is not sensitive to "L". This is particularly true in view of the wide range of the magnetic properties of the "L"-atoms in the compounds. The present results, therefore, strongly suggest that superconductivity in $LBa_2Cu_3O_{6+\partial}$ class must be associated with the $CuO_2$—Ba—$CuO_2$—Ba—$CuO_2$ plane assembly sandwiched by two layers of L-atoms, as represented in FIG. 13 for "L"=La. These Ba-coupled triple $CuO_2$-layers of ~7.7 A° thick may be disrupted by the L-layers only along the c-axis and thus may retain their quasi-two-dimensional characteristics. In the $K_2NiF_4$ structure of a $(La_{0.9}Ba_{0.1})_2CuO_{4-\partial}$ type oxide as shown also in FIG. 13, only individual square-lines of Cu-atoms with 6-coordination exist with a different stacking sequence. They are disrupted along the c-axis by the disordered La—Ba layers. The X-ray diffraction patterns for the two structural LaBCO compounds are also shown in FIG. 14 for comparison. The difference between the two structures is believed to be responsible for the 3-fold difference in $T_c$ It is expected that higher $T_c$ may be obtainable by structures with more than three $CuO_2$-layers coupled by more than two Ba-layers.

Although the $LM_2A_3O_{6+\partial}$ class of high temperature superconducting oxide complexes may be prepared by either the powder or compressed powder embodiment of the solid-state reaction method as previously described, it is preferred to use the compressed powder reaction method. Sample preparation parameters can affect the electronic and magnetic properties of the $LM_2A_3O_{6+\partial}$ class of oxide compounds drastically. It has been observed that the formation conditions for $LBa_2Cu_{6+\partial}$ for different "L's" are different. The reaction-time, the reaction temperature, the quenching rate, the reaction atmosphere and the compositions are all inter-related. For instance, oxide complexes within this class can be made insulating, partially superconducting or completely superconducting by varying the reaction atmosphere and the quenching rate while keeping the compositions unchanged. In spite of this wide range of variation of electrical properties, samples showed only very slight differences in their X-ray diffraction patterns, strongly suggesting that oxygen-content plays an important role in superconductivity of oxides.

Generally wherein the reaction atmosphere is a reduced oxygen atmosphere of about 2000μ the reaction may be conducted at a lower temperature than where the reaction is carried out under atmospheric conditions. Under a reduced oxygen atmosphere of about 2000μ the reaction temperature required to produce an oxide complex having superconducting properties is from about 800 to about 1000° C. and preferably from about 820 to about 950° C. For a reaction under atmospheric conditions the temperature required to produce superconducting properties is from about 900 to about 1100° C., preferably from about 950 to about 1000° C. For either type of reaction atmosphere higher temperatures, up to the melting point of the lowest melting component of the starting materials, could be employed; however it is generally preferred not to use such higher reaction temperatures since they may tend to degrade the superconducting properties of the resulting oxide complex compared to the optimum attainable by use of lower reaction temperatures. The optimum reaction temperature is dependent upon the elemental composition of the oxide complex being prepared and the optimum reaction temperature for a particular oxide complex may be established without undue experimentation. Reactions carried out at temperatures significantly lower than as discussed above generally result in an oxide complex that has only insulating or semiconducting electrical properties rather than superconducting properties.

The reaction atmosphere employed also influences the time of reaction to completion. Generally, reaction under a reduced oxygen atmosphere of about 2000μ requires a significantly shorter reaction, on the order of about 15 to 45 minutes for gram size reactions, compared to an atmospheric reaction, which generally requires from about 45 minutes to 8 hours for gram size reactions. A similar trend would be expected for larger scale reactions, although the optimum reaction time for such larger scale reaction would have to be determined by observation. One method for determination of the completion of reaction is to monitor samples by X-ray diffraction for depletion of diffraction peaks that correspond to the starting material and growth to maximum intensity of diffraction peaks which correspond to the desired tetragonal $LM_2A_3O_{6+\partial}$ phase. The optimum reaction time is dependant upon the elemental composition of the oxide complex being prepared and may be established by observation without undue experimentation. Optimum superconducting properties are obtained by timing the reaction to that point wherein the maximum amount of starting materials have been converted to the desired tetragonal $LM_2A_3O_{6+\partial}$.

When the reaction has proceeded to the point of maximum attainable $LM_2A_3O_{6+\partial}$ phase content, it is desirable to then rapidly quench the reaction material to room temperature. This generally produces a narrower temperature transition range between $T_{co}$ and $T_{c1}$ for the oxide complex so produced and also terminates any side reaction that may occur which would otherwise convert the $LM_2A_3O_{6+\partial}$ phase content to a nonsuperconducting phase structure. For material produced under atmospheric conditions rapid quenching is conveniently obtained by immediately transferring the reacted material from the heated reaction vessel to a heat sink. For gram quantities of material an aluminum plate adequately functions as a suitable heat sink for rapid quenching. Wherein the reacted material has been prepared in a reduced oxygen atmosphere, upon completion of the reaction the sample may be rapidly quenched by passing oxygen at ambient temperature over the reacted sample.

The superconducting compositions of the present invention have the potential for being used in a wide variety of applications. For example, when used in a wire or conductor form, they may be used in electrical power transmission, energy storage, controlled fusion reaction, electricity generation, mass transportation and magnets.

In a thin film form, they may be used in ultra-sensitive detectors and in ultra-fast computers. In addition, they may be used in a superconducting-magnetic-superconducting multi-layer form for use in ultra-sensitive ultra-fast electromagnetic micro devices.

The following examples are representative of the oxide complexes and methods of producing the oxide complexes of the invention. The examples for certain of the compositions also illustrate the enhancement of transition temperature that is produced by the application and maintenance of high pressure on the oxide complexes. Generally, the standard 4-probe technique was used to measure resistivity, and an inductance bridge was employed for ac magnetic susceptibility $\chi$-determination. The temperature was measured using the Au+0.07% Fe-chromel, and chromel-alumel thermocouples in the absence of a magnetic field, and a carbon-glass thermometer in the presence of a field. The latter was calibrated against the former without a field. Magnetic fields up to 6T were generated by a superconducting magnet.

EXAMPLE I 6.0 grams of $La_2O_3$, 0.61 grams of $SrCO3$ and 1.63 grams of CuO were mixed in a jar mill for about 12 hours. The mixture was then heated at a rate of about 10° C. per minute in air at 1 atmosphere pressure, until it reached a temperature of about 720° C. The mixture was then allowed to react for about an hour at about 720° C. After this reaction step, the temperature was raised to a temperature of about 1000° C. at a rate of about 30° C. per minute. Once at a 1000° C. temperature, the samples were maintained at this temperature for about twenty-one hours. This allowed the completion of a solid state reaction. After cooling to room temperature, the reacted mixture was pulverized in a jar mill for about 6 hours until the sample was homogenized. The pulverized mixture was then heated rapidly to a temperature of about 1000° C., and kept at that temperature for about seven hours. After this period, the mixture was cooled to room temperature and then compressed under a pressure of six kilobars. This compression converted the mixed powder into pellets. The pellets were then sintered into solid cylinders by heating them at a temperature of about 1000° C. for a period of about four hours at a pressure of almost zero kilobars. Finally, the sample was rapidly quenched from this temperature to room temperature in air.

The resulting lanthanum-strontium-copper-oxide composition had an empirical formula of $La_{1.8}Sr_{0.2}Cu_1O_y$. This corresponds to an oxide complex of the general formula $[La_{1-x}Sr_x]_aCu_bO_y$ wherein "x" is 0.1, "a" is 2, "b" is 1 and "y" is 2 to 4. The oxide complex composition had an onset superconductivity transition temperature ($T_{co}$) of 45°K, with a narrow transition width to complete superconductivity of about 10°K at ambient pressure.

EXAMPLE II 6.0 grams of $La_2O_3$, 0.61 grams of $SrCO_3$ and 1.63 grams of CuO were mixed mechanically in a jar mill for approximately 24 hours. The resulting mixture was then compressed into pellets by applying a pressure of about 2 kilobars. The pellets were heated to about 1000° C., and allowed to react for about twenty-four hours in air. The reacted pellets were then quenched rapidly to room temperature.

The La—Sr—Cu—O composition produced from this process had a formula of $La_{1.8}Sr_{0.2}Cu_1O_y$. This corresponds to an oxide complex of the general formula $[La_{1-x}Sr_x]_aCu_bO_y$ wherein "x" is 0.1, "a" is 2, "b" is 1 and "y" is 2 to 4. This composition showed superconductive properties at a temperature of about 42°K, with a narrow transition width of about 6°K at ambient pressure.

EXAMPLE III 6.0 grams of $La_2O_3$, 0.81 grams of $BaCO_3$ and 1.63 grams of CuO were mixed in a mortar-pestle apparatus for about 3 hours. The mixture was then heated at a rate of about 10° C. per minute in oxygen at a pressure of about 2000 microns Hg, until it reached a temperature of 720° C. The mixture was then allowed to react for about an hour at about 720° C. After this reaction, the temperature was raised to a temperature of about 950° C., this raise in temperature was made at a rate of about 30° C. per minute. Once at this temperature, the sample was maintained at this temperature for about twenty-one hours. After this period, the sample was cooled to room temperature and then the reacted mixture was pulverized until the sample was homogenized. The pulverized mixture was then heated rapidly to a temperature of about 950° C., and kept at that temperature for about seven hours. After this period, the sample was again cooled to room temperature and the mixture was compressed under a pressure of six kilobars. This compression converted the mixed powder into pellets. The pellets were then sintered into solid cylinders by heating them at a temperature of about 950° C. for a period of about four hours at ambient atmospheric pressure. Finally, the sample was rapidly quenched from this temperature to room temperature in air. The resulting lanthanum-barium-copper-oxide composition had the formula $La_{1.8}Sr_{0.2}Cu_1O_y$. The oxide complex so formed was of the formula $[La_{1-x}Ba_x]_aCu_bO_y$ wherein "x" is 0.1, "a" is 2, "b" is 1 and "y" is 2 to 4. This composition was found to be superconducting at 39°K at ambient pressure. This composition was then placed inside a pressure cell and the composition was compressed to a pressure of 14 kilobars at room temperature. After this compression step, the temperature was gradually reduced until the composition showed superconducting properties. This composition showed superconductivity properties at a temperature of 52.5°K at the applied pressure of 10 kilobars.

Figure 5:
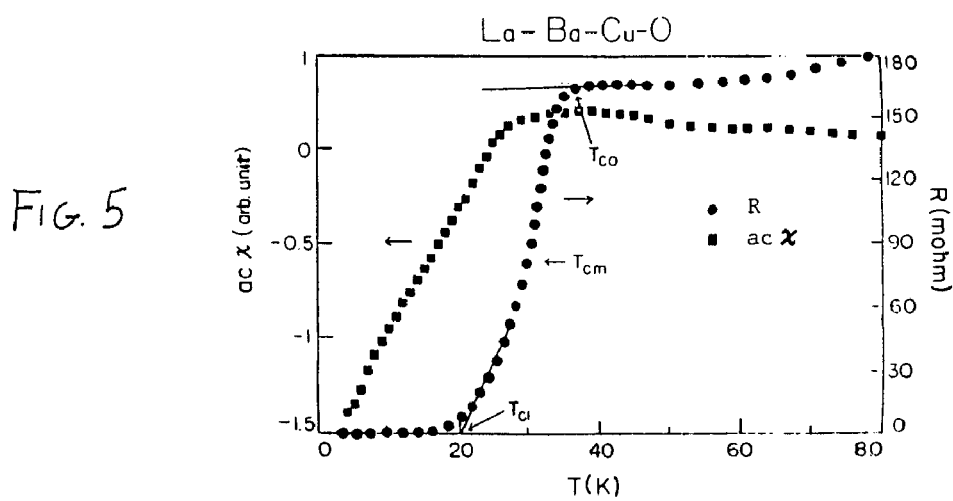
FIG. 5 illustrates the resistivity and diamagnetic shift as a function of temperature of a La—Ba—Cu—O composition prepared according to Example III.
Figure 6:
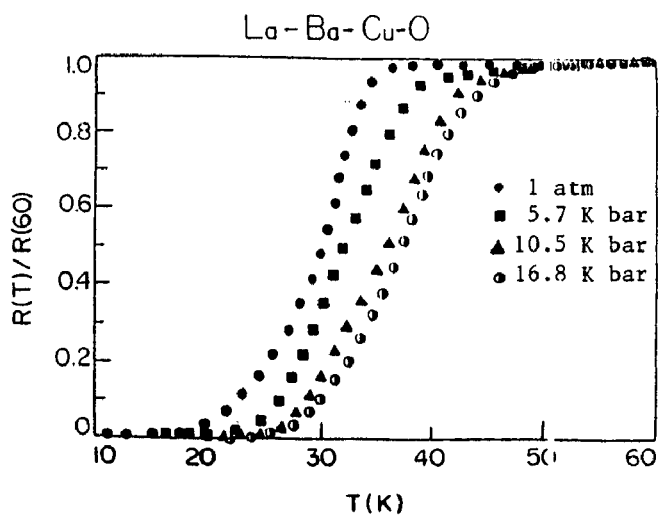
FIG. 6 illustrates the resistivity as a function of temperature under different applied pressures of 5.7 kilobars, 10.5 kilobars and 16.8 kilobars of a La—Ba—Cu—O composition as prepared according to Example III.
Figure 7:
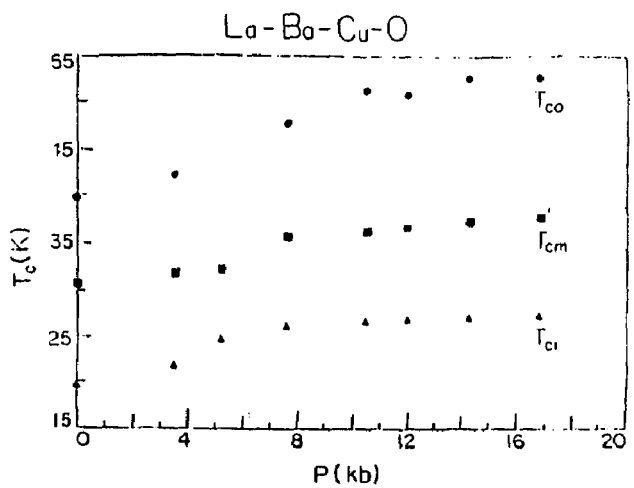
FIG. 7 illustrates the effect of applied pressure on onset temperatures ($T_{co}$), midpoint temperature ($T_{cm}$) and temperature for complete superconductivity ($T_{c1}$) of a La—Ba—Cu—O composition prepared according to Example III.

A sample prepared as described above exhibits only X-ray powder diffraction patterns characteristic of the single $K_2NiF_4$ phase with a resolution ~5%. The resistivity of this sample at ambient pressure decreases monotonically with decreasing temperature but at a reduced rate below 60°K. A large drop in resistivity sets in at ~39°K, indicative of the onset of a superconducting transition, and resistivity becomes zero at $T_{c1}$ ~20°K as shown in FIG. 5. Preliminary ac $\chi$-measurement showed diamagnetic shift starting at ~32°K and reaching a maximum of 10% of the signal of a superconducting Pb sample of a similar size. Under applied pressure, the superconducting transition is broadened but with an overall shift toward higher temperatures as shown in FIG. 6. $T_{co}$ has been enhanced from 39° to 52.5°K and the $T_{c1}$ from 20° to 25°K by application of a pressure of 12 kilobars as displayed in FIG. 7. The enhancement rate of $T_{co}$ and $T_{c1}$ is significantly reduced above 12 kilobars. The pressure effect on the midpoint temperature $T_{cm}$ where it has dropped by 50% of that at $T_{co}$ is also given in FIG. 7. $T_{cm}$ increases from 31° to 36°K under pressure. The decrease in the rate of $T_c$ enhancement at 12 kilobars is accompanied by an overall resistivity increase at about $T_{co}$, indicating the possible commencement of physical or chemical instabilities. Serious deterioration of samples is also detected upon removal of pressure, as evidenced by the dramatic increase in resistivity and a semiconducting behavior at low temperatures preceded by a drop in resistivity starting at $T_{co}$. The exact causes and remedy for the pressure induced sample deterioration above ~12 kilobars are currently under study.

One method of preparing the composition of this example in a wire form, while simultaneously reducing the interatomic distances between the atoms in the material, may include performing these reaction steps while $La_2O_3$ or $La(OH)_3$, $BaCO_3$ and CuO have been placed in a copper sleeve, or placing the reaction product of this mixture directly in the sleeve followed by drawing or extrusion. Because of the relative thermal expansion coefficients of the copper compared to the superconducting composition, the resulting lanthanum-barium-copper-oxide would be compressed by the walls of the copper sleeve. This compression will cause the $T_c$ of the material within the copper sleeve (the copper sleeve itself is not part of the superconductive material) to increase.

EXAMPLE IV 2.0 grams of $La_2O_3$, 0.2 grams of $BaCO_3$ and 0.53 grams of CuO were mixed mechanically in a mortar-pestle apparatus for approximately 3 hours. The resulting mixture was then compressed into pellets by applying a pressure of about 2 kilobars. The pellets were heated to about 1000° C., and allowed to react for about twenty-four hours in air. The reacted pellets were then quenched rapidly to room temperature.

The La—Ba—Cu—O composition produced from this process corresponds to the formula $[La_{1-x}Ba_x]_aCu_bO_y$, wherein "x" is 0.075, Ha "is 2, "b" is 1 and "y" is 2 to 4. The oxide complex of this example showed superconductive properties at a temperature of 36°K at atmospheric pressure.

EXAMPLE V 4.9 grams of $La_2O_3$, 1.1 grams of $BaCO_3$ and 2.8 grams of CuO were mixed in a mortar-pestle for 3 hours. The mixture was then heated in oxygen at a pressure of 15 microns Hg, until it reached a temperature of about 720° C. The temperature was increased at a rate of about 10° C. per minute. The mixture was then allowed to react for about an hour at about 720° C. After this reaction, the temperature was raised to a temperature of about 925° C., this raise in temperature was made at a rate of about 30° C. per minute. Once at this temperature, the samples were maintained at this temperature for about twenty-one hours. After this period, the mixture was cooled to room temperature and then the reacted mixture was pulverized until the sample was homogenized. The pulverized mixture was then heated rapidly to a temperature of about 925° C., and kept at that temperature for about seven hours. After this period, the mixture was compressed with a pressure of six kilobars. This compression converted the mixed powder into pellets. The pellets were then sintered into solid cylinders by heating them at a temperature of about 925° C. for a period of about four hours at ambient pressure. Finally, the sample was rapidly quenched from this temperature to room temperature in air. The oxide complex so formed corresponds to the general formula $[La_{1-x}Ba_x]_aCu_bO_y$, wherein "x" is 0.15, "a" is 1, "b" is 1 a and "y" is 2 to 4.

The resulting lanthanum-barium-copper-oxide composition, superconducting at 32°K at ambient pressure, was then placed under a pressure of 9 kilobars using a Be—Cu high pressure clamp using a fluid pressure medium. Pressure was measured using a superconducting Pb-manometer situated next to the sample at room temperature. As this compressed composition was cooled, it began showing superconductivity properties at a temperature of 40.2°K.

Figure 2:
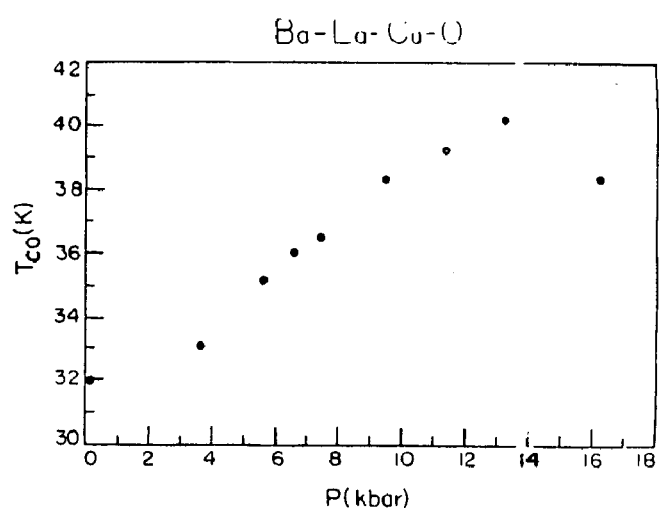
FIG. 2 illustrates the enhancement towards higher temperatures of the onset transition temperature ($T_{co}$) as applied pressure is increased upon a La—Ba—Cu—O composition as prepared according to Example V.

Powder X-ray diffraction patterns at room temperature showed that the sample was multiphased, consisting predominantly of $K_2NiF_4$ (~90%) and unidentified phases (<10%). Under applied pressures, resistivity at 300°K is suppressed and the drop in resistivity is broadened slightly, but with an overall shift toward higher temperature as shown in FIG. 1. $T_{co}$ increases rapidly with pressures as shown in FIG. 2. At 13 kilobars, $T_{co}$ is ~40.2°K. Under pressure, $T_{co}$ increases from 32° to 40.2°K at 13 kilobars at a rate ~0.9×10$^{-3}$°K bar$^{-1}$. Above 13 kilobars, the sample was damaged due to a shear strain introduced accidentally by applying pressure below −20° C., as evidenced by the appearance of a rapid resistivity increase following the resistivity drop at $T_{co}$ on cooling and the irreversibility of resistivity after the pressure was reduced.

Figure 3:
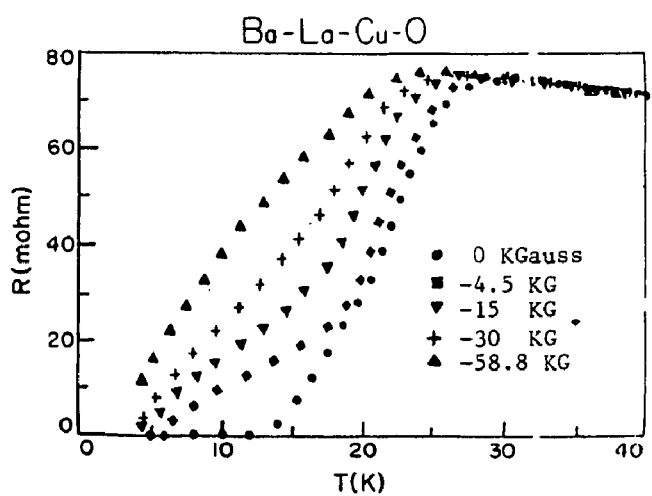
FIG. 3 illustrates the magnetic field effect on resistivity of a La—Ba—Cu—O composition as prepared according to Example V.
Figure 4:
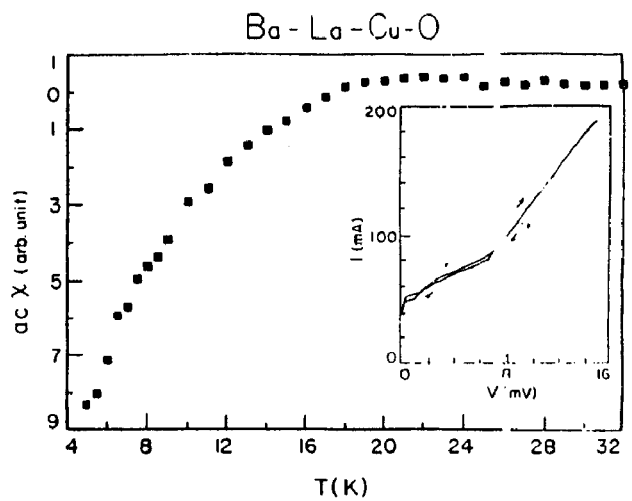
FIG. 4 illustrates the magnetic susceptibility as a 15 function of temperature of a La—Ba—Cu—O composition as prepared according to Example V.

FIG. 3 displays the magnetic field effect on 5 resistivity as a function of temperature. It is clear that the rapid resistivity drop is suppressed and the zero resistivity state at 4°K can be destroyed by magnetic fields. Below 18°K, a diamagnetic shift is clearly evident and reaches a maximum of 2% of the signal of a superconducting Pb sample of the same size as shown in FIG. 4. The insert of FIG. 4 shows the current-voltage characteristics for the sample at 4.2°K. The zero resistivity state is removed as current exceeds a critical value which increases with decreasing temperature. All these strongly demonstrate that the resistivity drop is associated with a superconducting transition.

EXAMPLE VI 6.0 grams of $La_2O_3$, 0.61 grams of $SrCO_3$ and 1.63 grams CuO were mixed mechanically in a mortar-pestle for approximately 3 hours. The resulting mixture was then compressed into pellets by applying a pressure of about 3 kilobars. The pellets were heated to about 1000° C., and allowed to react for about twenty-four hours in air. The reacted pellets were then quenched rapidly to room temperature.

The La—Sr—Cu—O composition produced from this process corresponds to the general formula $[La_{1-x}Sr_x]_aCu_bO_y$, where "x" is 0.1, "a" is 2, "b" is 1, and "y" is 2 to 4. The oxide complex was placed under a pressure of 16 kilobars, at room temperature. Upon cooling this oxide complex composition showed superconducting properties at a temperature of 42° K at atmospheric pressure. The oxide complex composition under a pressure of 16 kilobars showed superconducting properties at 54° K.

EXAMPLE VII

The magnetic layer in a superconducting-magnetic-superconducting multi-layer device could consist of a lanthanum-barium-copper-oxide base composition. Such a composition may be prepared as follows. 3.0 grams $La_2O_3$, 3.6 grams $BaCO_3$ and 2.9 grams CuO were mixed and heated in a vacuum about 10 microns Hg at a temperature of about 1000° C. for about twenty-four hours.

The resulting product formed a magnetic compound with a 10 magnetic ordering temperature below 40°K.

The superconducting-magnetic-superconducting multilayer structures may therefore be formed by subjecting the overlayer of La—Ba—Cu—O, which is separated from the superconducting underlayer by an ultra-thin protective covering of, for example $SiO_2$, to a vacuum of 10 microns Hg at a temperature of between about 900° C. and 1100° C. Thin film samples of the composition of the present invention may be synthesized by alternative current or radio frequency sputtering of a sintered La—Ba—Cu—O target in an argon atmosphere having about 10% oxygen and a pressure of between $10^{-2}$ and 2 microns Hg. Heat treatment of such film samples at 15–2000 microns Hg pressure in an oxygen atmosphere should make the superconducting properties of the film samples similar to those for the sintered samples.

EXAMPLE VIII

A La—Ba—Cu—O composition was prepared in accordance with the procedure described in Example II except that $La_2O_3$, $BaCO_3$ and CuO were used in the amounts appropriate to provide an oxide complex of the formula $[La_{1-x}B_a]_aCu_bO_y$, wherein "x" is 0.1, "a" is 2, "b" is 1 and "y" is between 3 and 4, and an intensive mixer ball mill was used rather than a jar mill. The oxide complex 50 produced showed superconductive properties at a temperature of 60°K at an applied pressure of 12 kilobars.

EXAMPLE IX

A La-A(trace)—Cu—O composition was prepared in accordance with the procedure described in Example II except that $La_2O_3$, $ACO_3$ and CuO were used in the amounts appropriate to provide an oxide complex of the formula $[La_{1-x}B_a]Cu_bO_y$, wherein "x" is about 0.01, "a" is 2, "b" is 1 and "y" is between 3 and 4, and an intensive mixer ball mill was used for mixing rather than a jar mill. "A" was either barium or strontium. The oxide complex so produced showed superconductive properties at an onset temperature of 100°K at 1 atmosphere.

EXAMPLE X

A La—Ba—Cu—O composition was prepared in accordance with the procedure of Example II except that $La_2O_3$, $BaCO_3$ and CuO were used in the amounts appropriate to provide an oxide complex of the formula $[La_{1-x}Ba_x]_aCu_bO_y$, wherein "x" is about 0.4, "a" is 1, "b" is 1 and "y" is between 2 and 3, and the heat treatment was done at $10^{-4}$ microns Hg in air, rather than at atmospheric pressure. The oxide complex so produced showed superconductive properties at an onset temperature of 100°K.

EXAMPLE XI

A yttrium oxide complex was prepared with a nominal composition represented by $[Y_{1-x}B_a]_aCu_bO_y$, wherein "x" is 0.4, "a" is 2, "b" is 1 and "y" is less than or equal to 4. The yttrium oxide complex was prepared by intensively mixing appropriate amounts of $Y_2O_3$, $BaCO_3$ and CuO. The oxide mixture was then compressed to pellets at an applied pressure of 100 to 500 psi, the resulting pellets were then heated in air at a temperature between 900 to 1100° C. for about 15 minutes then rapidly quenched to room temperature in air.

Bar samples of dimensions 1 mm×0.5 mm×4 mm were cut from the sintered cylinders. A four-lead technique was employed for the resistance (R) measurements and an ac inductance bridge for the magnetic susceptibility ($\chi$) determinations.

Figure 8:
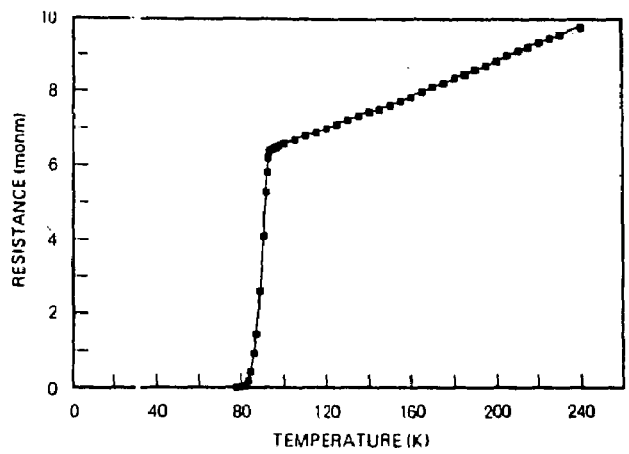
FIG. 8 illustrates the reduction in electrical resistance as temperature is decreased of a Y—Ba—Cu—O composition as prepared according to Example XI.
Figure 9:
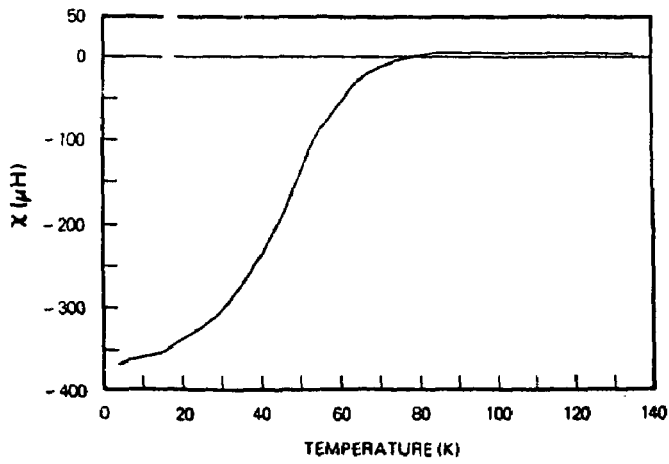
FIG. 9 illustrates the temperature dependence of magnetic susceptibility of a Y—Ba—Cu—O composition as prepared according to Example XI.
Figure 10:
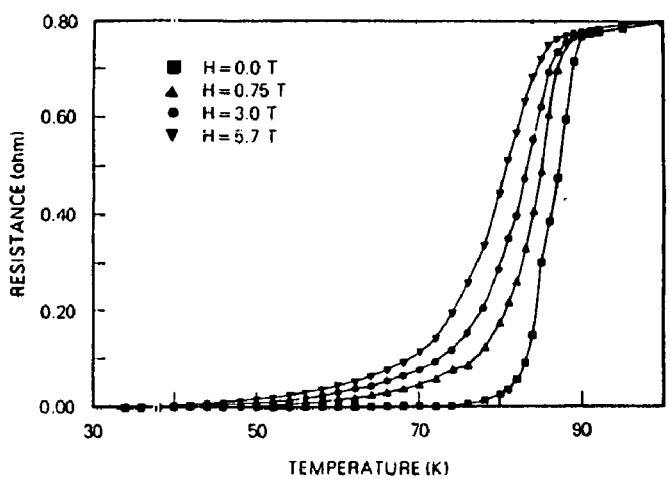
FIG. 10 illustrates the magnetic field effect on the resistance of a Y—Ba—Cu—O composition as prepared according to Example XI.

The temperature dependence of resistance for this Y—Ba—Cu—O oxide complex was determined in a simple liquid nitrogen dewar with results as shown in FIG. 8. Resistance (R) initially dropped linearly with temperature (T). A deviation of resistance from the linear temperature dependence was evidenced at 93° K. A zero resistivity state was achieved at 80°K. (However, when the pellets were quenched on an aluminum plate as a heat sink to room temperature in air, the zero resistance state was achieved at 90°K.) The variation of magnetic susceptibility ($\chi$) with temperature was measured with the results as shown in FIG. 9. A diamagnetic shift was observed to start at 91°K and the size of the shift increased rapidly with further cooling. At 4.2°K, the diamagnetic signal corresponded to 24% of the superconducting signal of a lead sample with similar dimensions. In a magnetic field, the drop in resistivity shifted toward lower temperature as shown in FIG. 10. At the maximum field applied, the zero reisitivity state remained at temperature as high as 40°K. Preliminary X-ray powder diffraction patterns showed the existence of multiple phases apparently uncharacteristic of the $K_2NiF_4$— structure in the samples.

The above results demonstrate unambiguously that superconductivity occurs in the Y—Ba—Cu—O oxide complex with a transition between 80 and 93°K (and 90–93°K when quenched on the aluminum plate). The upper critical field $H_{c2}$ (T) was determined resistively. If the positive curvature at very low fields is neglected, a value of $dH_{c2}/dt$ near T is observed to be the 3T/K or 1.3T/K, depending on if $H_{c2}$ ($T_c$) is taken at the 10% drop of the normal state resistivity, or the 50% drop. In the 35 weak-coupling limit, $H_{c2}(0)$ was estimated as between 80 and 180T in the Y—Ba—Cu—O oxide complex. The paramagnetic limiting field to 0°K for a sample with a $T_c$~90K is 165T.

EXAMPLE XII 100 mg of $Y_2O_3$, 349.57 mg of $BaCO_3$ and 211.39 mg of CuO were thoroughly mixed by mortar-pestle. Mixing continued until microscopic examination revealed that the white $Y_2O_3$ and $BaCO_3$ powders had thoroughly mixed with the dark CuO powder to produce a mixture of uniform color without any regions or streaks of white or lighter color. The powder mixture was then pressed to pellets of about 3/16 inch diameter and 1/16 inch thickness in a pellet die by application of about 250 psi pelletization pressure. The pellets were then reacted under atmospheric conditions at a temperature of 1000° C. for about 20 to about 30 minutes and thereafter removed from the oven and placed upon an aluminum heat sink plate to rapidly quench the reacted pellets to ambient temperature. The $T_{d1}$, $T_{co}$, $T_{c1}$ and X-ray diffraction lattice parameters measured for this YBCO complex are reported in Table 1.

EXAMPLE XIII 100 mg of $La_2O_3$, 242.271 mg of $BaCO_3$ and 146.478 mg of CuO were thoroughly mixed by mortar-pestle until a mixture of uniform color was obtained as determined by microscopic examination. The powder mixture was then pressed to pellets of about 3/16 inch diameter and 1/6 inch thickness in a pellet die by application of about 250 psi pelletization pressure. The pellets were then reacted in air for about 8 hours following which the pellets were reacted for about 20–30 minutes under a reduced-oxygen atmosphere (~2000µ) at 850° C., then quenched by passing ambient temperature oxygen through the reaction zone containing the pellets. The $T_{d1}$, $T_{co}$, $T_c$, and X-ray diffraction lattice parameters determined for this LaBCO complex are reported in Table 1.

EXAMPLE XIV $LBa_2Cu_3O_{6+\partial}$ oxide complexes wherein "L" is Nd, Sm, Eu, Gd, Er and Lu were prepared with the quantities of materials and at the reaction temperatures as given below:

| $L_2O_3$ | $BaCO_3$ | CuO | Reaction Temp. ° C. |
|---|---|---|---|
| $Nd_2O_3$ 100 mg | 234.588 mg | 141.834 mg | 900° C. |
| $Sm_2O_3$ 100 mg | 226.25 mg | 136.79 mg | 950° C. |
| $Eu_2O_3$ 100 mg | 224.27 mg | 135.6 mg | 950° C. |
| $Gd_2O_3$ 100 mg | 217.73 mg | 133.18 mg | 900° C. |
| $Er_2O_3$ 100 mg | 206.358 mg | 124.763 mg | 820° C. |
| $Lu_2O_3$ 100 mg | 198.359 mg | 119.927 mg | 830° C. |

In each instance the powder components were thoroughly mixed by mortar-pestle until microscopic examination revealed a powder mixture of uniform color. In each instance the resulting powder mixture was pressed into pellets of about 3/16 inch diameter and 1/16 thickness in a pellet die by application of about 250 psi pelletization pressure. In each instance the resulting pellets were then reacted for about 20 minutes under a reduced oxygen atmosphere (~2000µ) at the reaction temperatures as above indicated, following which each was quenched to ambient temperature by passing ambient temperature oxygen over the reacted pellets. The $T_{d1}$, $T_{co}$, $T_{c1}$ and X-ray diffraction lattice parameters measured for each of the resulting NeBCO, SaBCO, EBCO, GaBCO, ErBCO and LuBCO samples are reported in Table 1.

TABLE I

| OXIDE COMPLEX | Resistance-Temperatures Properties | | | X-Ray Lattice Parameters | | |
|---|---|---|---|---|---|---|
| | $T_{c0}$ (° K) | $T_{c1}$ (° K) | $T_{d1}$ (° K) | a(A) | b(A) | c(A) |
| $YBa_2Cu_3O_{6+\partial}$ | 98 | 94 | 100 | 3.86 ± 0.02 | 3.86 ± 0.02 | 11.71 ± 0.02 |
| $LaBa_2Cu_3O_{6+\partial}$ | 91 | 75 | 99 | 3.95 ± 0.02 | 3.95 ± 0.02 | 11.79 ± 0.02 |
| $NdBa_2Cu_3O_{6+\partial}$ | 91 | 70 | 93 | 3.89 ± 0.02 | 3.89 ± 0.02 | 11.73 ± 0.02 |
| $SmBa_2Cu_3O_{6+\partial}$ | 94 | 82 | 135 | 3.88 ± 0.02 | 3.88 ± 0.02 | 11.73 ± 0.02 |
| $EuBa_2Cu_3O_{6+\partial}$ | 94 | 88 | 160 | 3.86 ± 0.02 | 3.86 ± 0.02 | 11.74 ± 0.04 |
| $GdBa_2Cu_3O_{6+\partial}$ | 95 | 92 | 135 | 3.89 ± 0.02 | 3.89 ± 0.02 | 11.73 ± 0.02 |
| $ErBa_2Cu_3O_{6+\partial}$ | 94 | 87 | 120 | 3.83 ± 0.02 | 3.85 ± 0.02 | 11.65 ± 0.02 |
| $LuBa_2Cu_3O_{6+\partial}$ | 91 | 85 | 120 | 3.83 ± 0.02 | 3.37 ± 0.02 | 11.73 ± 0.02 |

As is readily apparent from the above description, additional advantages and modifications will readily occur to those skilled in the art. The invention in its broader aspects is therefore not limited to the specific examples shown and described. Accordingly, departures may be made from the details shown in the examples without departing from the spirit or scope of the disclosed general inventive concept.

What is claimed is:

1. A composition which is superconductive at a temperature of 70°K and higher, comprising:
a metal oxide the formula $$[L_{l-x}M_x]_a A_b O_y$$

wherein;
"L" is yttrium, lanthanum, neodymium, samarium, europium, gadolinium, dyprosium, holmium, erbium, thulium, ytterbium, lutetium, or mixtures thereof; "M" is barium, strontium, or mixtures thereof; "A" is copper, "x" is from about 0.65 to 0.80; "a" is 1; "b" is 1; and "y" is a value from about 2 to about 4 that provides the metal oxide with zero electrical resistance at a temperature of 70°K or above.

2. The superconducting composition of claim 1, wherein "M" is barium.

3. The superconducting composition of claim 2, wherein "x" is about 0.667.

4. The superconducting composition of claim 3, wherein "L" is yttrium, lanthanum neodymium, samarium, europium, gadolinium, erbium or lutetium.

5. The superconducting composition of claim 1, wherein the metal oxide has the formula $$LM_2A_3O_{6+\partial}$$

and $\partial$ is a number value from about 0.1 to about 1.0 that provides the oxide complex with zero electrical resistance at a temperature of 70°K or above.

6. The superconducting composition of claim 5, wherein "M" is barium.

7. The superconducting composition of claim 6, wherein "L" is yttrium, lanthanum neodymium, samarium, europium, gadolinium, erbium or lutetium.

8. A material containing a sufficient quantity of a superconductive crystalline phase to cause the material to exhibit substantially zero electrical resistance at a temperature of 77°K or above; said crystalline phase composition having the formula $LM_2Cu_3O_{6+\partial}$, wherein "L" is Y, La, Nd, Sm, Eu, Gd, Dy, Ho, Er, Tm, Yb, Lu, or mixtures thereof; "M" is Ba, Sr or mixtures thereof; and $\partial$ is a value from about 0.1 to about 1.0 that provides the composition with zero electrical resistance at a temperature of 77°K or above.

9. The material of claim 8 wherein L is Y and M is Ba.

10. The material of claim 8 wherein L is, Sm, Eu, Gd, Er, or Lu and M is Ba.

11. A method for making a superconducting metal oxide, comprising the steps of:

mixing solid compounds containing L, M, A and O in amounts appropriate to yield the formula $[L_{1-x}M_x]_a A_b O_y$ wherein "L" is yttrium, lanthanum, neodymium, samarium, europium, gadolinium, dysprosium, holmium, erbium, thulium, ytterbium, lutetium, or a combination thereof; "M" is barium, strontium, or a combination thereof; "A" is copper, "a" is 1 to 2; "b" is 1; "x" is about 0.01 to about 1.0; and "y" is a value from about 2 to about 4 that provides the metal oxide with zero electrical resistance at a temperature of 40°K or above;

compacting the mixture into a solid mass by application of pressure from about 100 to about 30,000 psi;

heating the solid mass in air to a temperature of from about 800 to about 1000° C. for a time sufficient to react the compacted mixture in the solid state; and quenching the solid mass to ambient temperature in air.

12. The method of claim 11, wherein "M" is barium.

13. The method of claim 12, wherein "x" is about 0.65 to about 0.80 and "a" is 1.

14. The method of claim 13, wherein the mixture is compacted to a solid mass by application of pressure of from about 100 to about 500 psi.

15. The method of claim 14, wherein the solid mass is heated under a reduced oxygen atmosphere of about 2000µ at a temperature of from about 820° C. to about 950° C.

* * * * *

UNITED STATES PATENT AND TRADEMARK OFFICE
CERTIFICATE OF CORRECTION

| | | |
|---|---|---|
| PATENT NO. | : 7,056,866 B1 | Page 1 of 1 |
| APPLICATION NO. | : 07/032041 | |
| DATED | : June 6, 2006 | |
| INVENTOR(S) | : Chu | |

It is certified that error appears in the above-identified patent and that said Letters Patent is hereby corrected as shown below:

On the title page,
[*] delete "Subject to any disclaimer, the term of this patent is extended or adjusted under 35 U.S.C. 154(b) by 785 days."

Signed and Sealed this

Fifth Day of June, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,056,866 B1 | Page 1 of 1 |
| APPLICATION NO. | : 07/032041 | |
| DATED | : June 6, 2006 | |
| INVENTOR(S) | : Ching-Wu Chu | |

It is certified that error appears in the above-identified patent and that said Letters Patent is hereby corrected as shown below:

In the claims:

Claim 1 (column 18, line 30) the formula reading "$[L_{l-x}M_x]_a A_b O_y$" should read -- $[L_{1-x}M_x]_a A_b O_y$ --

Signed and Sealed this
Tenth Day of July, 2012

David J. Kappos
*Director of the United States Patent and Trademark Office*